(12) United States Patent
Ning et al.

(10) Patent No.: US 11,843,005 B2
(45) Date of Patent: Dec. 12, 2023

(54) HALF VIA HOLE STRUCTURE, MANUFACTURING METHOD THEREOF, ARRAY SUBSTRATE, AND DISPLAY PANEL

(71) Applicants: Chongqing BOE Optoelectronics Technology Co., Ltd., Chongqing (CN); BOE Technology Group Co., Ltd., Beijing (CN)

(72) Inventors: Zhiyong Ning, Beijing (CN); Zhonghao Huang, Beijing (CN); Chao Zhang, Beijing (CN); Zhaojun Wang, Beijing (CN); Hongru Zhou, Beijing (CN); Yutong Yang, Beijing (CN); Rui Wang, Beijing (CN); Xu Wu, Beijing (CN); Kunkun Gao, Beijing (CN)

(73) Assignees: Chongqing BOE Optoelectronics Technology Co., Ltd., Chongqing (CN); BOE Technology Group Co., Ltd., Beijing (CN)

(*) Notice: Subject to any disclaimer, the term of this patent is extended or adjusted under 35 U.S.C. 154(b) by 181 days.

(21) Appl. No.: 17/432,105

(22) PCT Filed: Feb. 1, 2021

(86) PCT No.: PCT/CN2021/074708
§ 371 (c)(1),
(2) Date: Aug. 19, 2021

(87) PCT Pub. No.: WO2021/190147
PCT Pub. Date: Sep. 30, 2021

(65) Prior Publication Data
US 2022/0344377 A1    Oct. 27, 2022

(30) Foreign Application Priority Data

Mar. 23, 2020    (CN) .......................... 202010210048.0

(51) Int. Cl.
*H01L 27/12* (2006.01)

(52) U.S. Cl.
CPC ...... *H01L 27/1244* (2013.01); *H01L 27/1259* (2013.01)

(58) Field of Classification Search
None
See application file for complete search history.

(56) References Cited

U.S. PATENT DOCUMENTS

2015/0346529 A1* 12/2015 Park ................ G02F 1/136227
                                                           438/23
2018/0102379 A1    4/2018 Gan et al.
2021/0343747 A1    11/2021 Yan et al.

FOREIGN PATENT DOCUMENTS

CN        104617110 A    5/2015
CN        105590896 A    5/2016
(Continued)

OTHER PUBLICATIONS

Machine-generated English translation of WO 2019072120, total pp. 22 (Year: 2019).*

(Continued)

*Primary Examiner* — Bo B Jang
(74) *Attorney, Agent, or Firm* — Ling Wu; Stephen Yang; Ling and Yang Intellectual Property

(57) ABSTRACT

A half via hole structure, a method for manufacturing the same, an array substrate, and a display panel are provided. The half via hole structure includes: a spacer layer arranged on an underlaying substrate; a passivation layer arranged on the spacer layer and provided with a first via hole, an orthographic projection of the first via hole on the underlaying substrate being within that of the spacer layer on the underlaying substrate; a first conductive layer arranged on the spacer layer and having a width smaller than a diameter of the first via hole; an insulating layer arranged between the (Continued)

spacer layer and the passivation layer and provided with a second via hole; and a second conductive layer arranged on the passivation layer and overlapped with the first conductive layer through the first via hole.

12 Claims, 7 Drawing Sheets

(56) References Cited

FOREIGN PATENT DOCUMENTS

| CN | 107316839 A | 11/2017 |
|---|---|---|
| CN | 111244116 A | 6/2020 |
| WO | 2019072120 A1 | 4/2019 |

OTHER PUBLICATIONS

International Search Report for PCT/CN2021/074708 dated May 10, 2021.

* cited by examiner ional filing date of Feb. 1, 2021, which claims
HALF VIA HOLE STRUCTURE, MANUFACTURING METHOD THEREOF, ARRAY SUBSTRATE, AND DISPLAY PANEL

CROSS-REFERENCE TO RELATED APPLICATION

The present application is a U.S. National Phase Entry of International Application PCT/CN2021/074708 having an international filing date of Feb. 1, 2021, which claims priority of Chinese Patent Application No. 202010210048.0, filed on Mar. 23, 2020 and entitled "Half Via hole Structure, Manufacturing Method Thereof, Array Substrate, and Display Panel", the content of which should be construed as being hereby incorporated by reference.

TECHNICAL FIELD

One or more embodiments of the present disclosure relate, but are not limited, to the technical field of display, and in particular to a half via hole substrate, a method for manufacturing the half via hole substrate, an array substrate, and a display panel.

BACKGROUND

In a manufacturing process of an array substrate, wiring design on the array substrate is quite important. Film layers of different levels such as data lines, gate lines, and common electrode lines, need to be electrically connected with one another through via holes or half via holes.

However, a bad undercut easily occurs at a via hole structure or a half via hole structure, which makes a transparent conductive film layer at the undercut in poor contact and prone to breakage. In addition, the transparent conductive film layer at the undercut is easy to be burnt and has low reliability in a reliability process.

SUMMARY

The following is a summary about the subject matter described in the present disclosure in detail. The summary is not intended to limit the scope of protection of the claims.

One or more embodiments of the present disclosure provide a half via hole structure, which includes:
  a spacer layer, arranged on an underlaying substrate;
  a passivation layer, arranged on the spacer layer and provided with a first via hole, wherein an orthographic projection of the first via hole on the underlaying substrate is within an orthographic projection of the spacer layer on the underlaying substrate;
  a first conductive layer, arranged on the spacer layer and having a width smaller than a diameter of the first via hole;
  an insulating layer, arranged between the spacer layer and the passivation layer and provided with a second via hole; and
  a second conductive layer, arranged on the passivation layer and overlapped with the first conductive layer through the first via hole.

In an exemplary implementation mode, the spacer layer includes a spacer layer body and a spacer layer step connected to the spacer layer body. A thickness of the spacer layer step is smaller than a thickness of the spacer layer body.

In an exemplary implementation mode, the orthographic projection of the first via hole on the underlaying substrate is within an orthographic projection of the spacer layer body on the underlaying substrate. An orthographic projection of the second via hole on the underlaying substrate is within the orthographic projection of the spacer layer body on the underlaying substrate.

In an exemplary implementation mode, the second via hole is provided to be concentric with the first via hole. A diameter of the second via hole is larger than a diameter of the first via hole.

In an exemplary implementation mode, the thickness of the spacer layer body is 5,000 to 6,000 Å. The thickness of the spacer layer step is 1,000 to 2,000 Å.

In an exemplary implementation mode, a material for forming the spacer layer includes a metallic conductive material.

One or more embodiments of the present disclosure further provide a method for manufacturing a half via hole structure, which includes:
  forming a spacer layer on an underlaying substrate;
  forming an insulating layer on the spacer layer, wherein the insulating layer includes a second via hole on the spacer layer;
  forming a first conductive layer on the spacer layer;
  forming a passivation layer on the insulating layer, wherein a first via hole is formed on the passivation layer, a diameter of the first via hole is larger than a width of the first conductive layer, and an orthographic projection of the first via hole on the underlaying substrate is within an orthographic projection of the spacer layer on the underlaying substrate; and
  forming a second conductive layer on the passivation layer in a manner that the second conductive layer is overlapped with the first conductive layer through the first via hole.

In an exemplary implementation mode, the spacer layer includes a spacer layer body and a spacer layer step connected to the spacer layer body. A thickness of the spacer layer step is smaller than a thickness of the spacer layer body. The step of forming the spacer layer on the underlaying substrate includes:
  forming a spacer layer material on the underlaying substrate;
  forming a photoresist layer on the spacer layer material in a manner that a thickness of a middle region of the photoresist layer is larger than a thickness that of a peripheral region;
  stripping the photoresist layer of the peripheral region;
  etching the spacer layer material from which the photoresist layer is stripped to form the spacer layer step; and
  stripping the photoresist layer of the middle region to form the spacer layer body.

In an exemplary implementation mode, the step of forming the insulating layer on the spacer layer includes:
  forming an insulating layer material on the spacer layer, wherein an area of the insulating layer material is larger than an area of the spacer layer;
  forming a photoresist layer on the insulating layer material;
  stripping the photoresist layer of an insulating layer material region above the spacer layer, and etching the insulating layer material region to form the second via hole; and
  stripping the photoresist layer of another region.

In an exemplary implementation mode, the method further includes:

making the orthographic projection of the first via hole on the underlaying substrate locate within an orthographic projection of the spacer layer body on the underlaying substrate; and making an orthographic projection of the second via hole on the underlaying substrate locate within the orthographic projection of the spacer layer body on the underlaying substrate.

One or more embodiments of the present disclosure further provide an array substrate, which includes an underlaying substrate and the half via hole structure as described in any abovementioned implementation mode or embodiment arranged on the underlaying substrate.

One or more embodiments of the present disclosure further provide a display panel, which includes the array substrate as described in any abovementioned implementation mode or embodiment.

Other aspects may be comprehended upon reading and understanding of the drawings and the detailed descriptions.

BRIEF DESCRIPTION OF DRAWINGS

In order to describe one or more embodiments of the present disclosure or the related technical solutions more clearly, accompanying drawings required to be used in the description about the embodiments will be simply introduced below. It is apparent that the drawings in the following description are only for one or more embodiments of the present disclosure. Other drawings may further be obtained by those of ordinary skill in the art according to these drawings without using inventive work.

DETAILED DESCRIPTION

The present disclosure will further be described below in combination with specific embodiments and with reference to the drawings in detail.

Unless otherwise defined, technical terms or scientific terms used in one or more embodiments of the present disclosure should have the same meanings as commonly understood by those of ordinary skill in the art to which the present disclosure pertains. "First", "second", and similar terms used in one or more embodiments of the present disclosure do not represent any order, number, or importance but are only adopted to distinguish between different components. "Include", "contain", or a similar term means that an element or object preceding the term covers an element or object and equivalent thereof following the term and does not exclude other elements or objects. "Connect", "mutually connected", or similar terms are not limited to physical or mechanical connection but may include electrical connection, either direct or indirect. "Upper", "lower", "left", "right", etc., are used to represent relative positional relations, and when an absolute position of a described object is changed, the relative positional relation may also be correspondingly changed.

Figure 1:
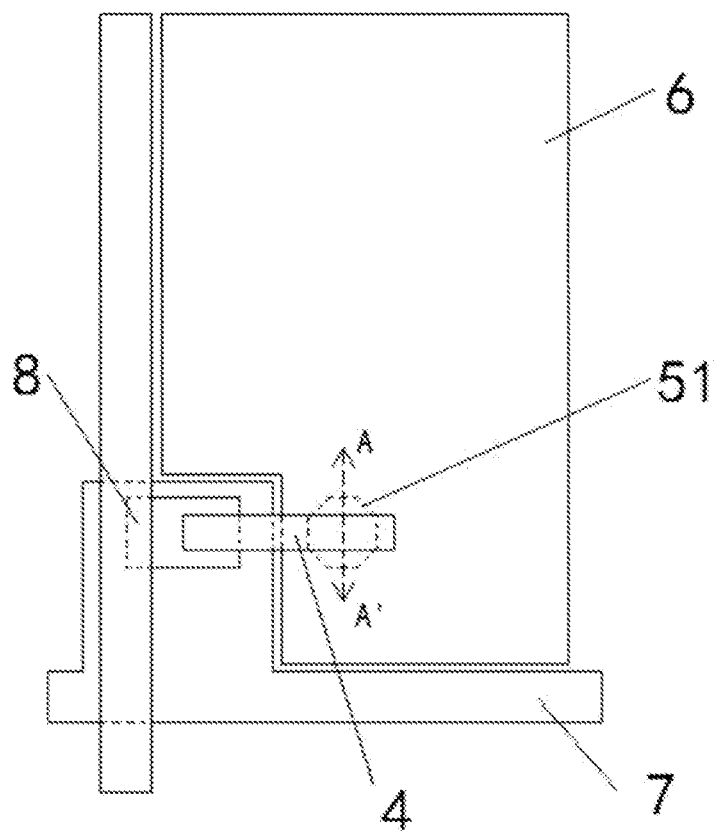
FIG. 1 is a plan view of a half via hole structure design.
Figure 2:
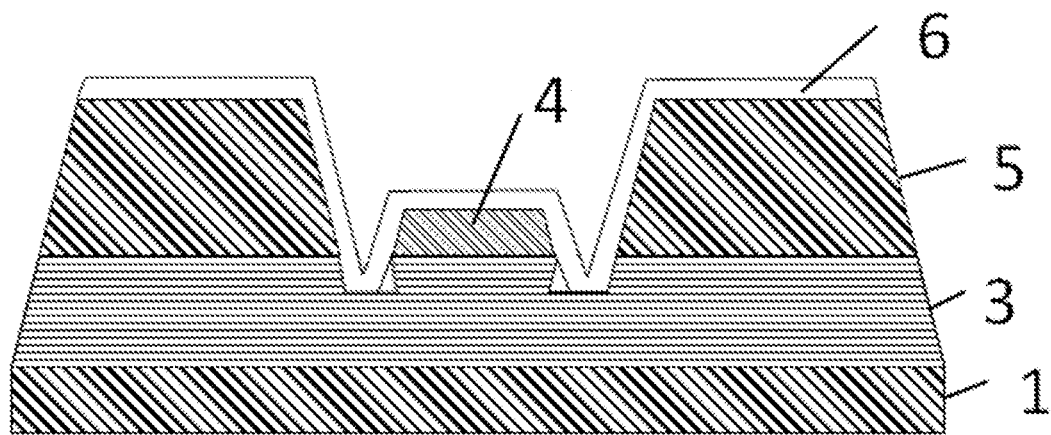
FIG. 2 is a sectional view along AA' direction in FIG. 1.
Figure 3:
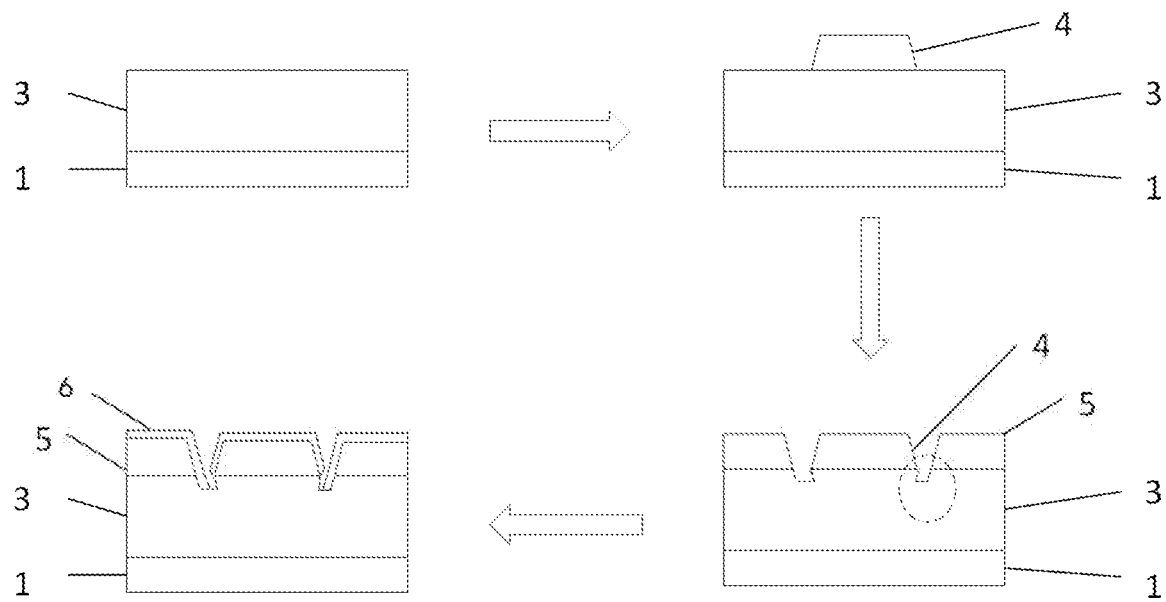
FIG. 3 is a schematic diagram of a manufacturing flow of an array substrate.

In a manufacturing process of an array substrate, wiring design on the array substrate is quite important. Film layers of different levels such as data lines, gate lines, and common electrode lines need to be electrically connected with one another through via holes. With the development of display technology and the pursuit of people for display quality, display products have been increasingly developed towards high Pixels Per Inch (PPI) displaying. On a display panel with a certain size, if the PPI is larger, a pixel pitch is smaller, and designers are confronted with a greater challenge. A half via hole structure design shown in FIGS. 1 and 2 is usually adopted to meet the requirements on the process capability and reliability under a relatively small pixel pitch. FIG. 1 is a schematic plan view of an array substrate. FIG. 2 is a sectional view along A-A' direction in FIG. 1. Referring to FIGS. 1 and 2, a passivation layer half via hole 51 is formed on a surface of a passivation layer (PVX) 5. The passivation layer half via hole 51 is on a drain metal layer (SD metal layer) 4 of a Thin Film Transistor (TFT) component. A transparent conductive film layer 6 is partially overlapped with a surface of the drain metal layer 4 to conductively connect the transparent conductive film layer 6 with the drain metal layer 6 of the thin film transistor. A diameter of the passivation layer half via hole 51 is required to be larger than a width of the drain metal layer 4. In such case, in a PVX etch process, as shown in FIG. 3, a Gate Insulator (GI) 3 below the drain metal layer 4 may be partially etched off (as shown by the circle in FIG. 3), and a weak point is formed after an Indium Tin Oxide (ITO) layer is completed. An undercut may be formed at the weak point, which makes the transparent conductive film layer 6 at the undercut in poor contact and easy to get open.

Figure 4:
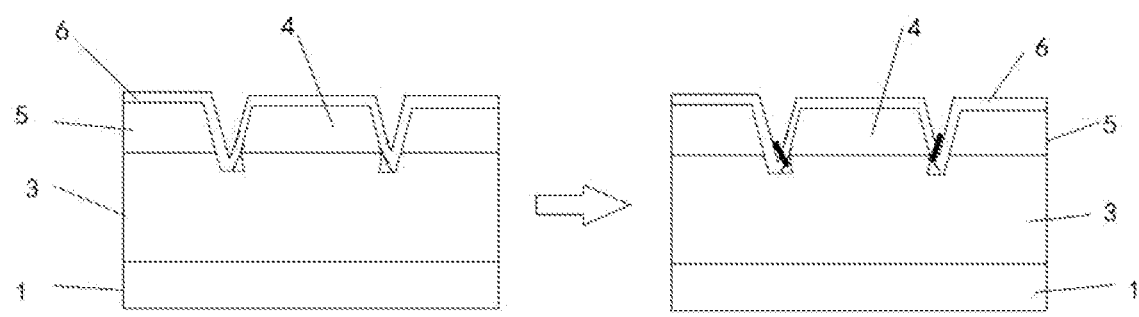
FIG. 4 is a schematic diagram of a reliability process.

Meanwhile, referring to FIG. 4, under a reliability condition, signals continuously pass through the transparent conductive film layer 6 at the undercut after input to the display panel. The transparent conductive film layer 6 at the undercut is in poor contact and high in resistance, and the continuous conversion of the signals from high level to low level and the continuous increase of load causes continuous accumulation of heat at the undercut to finally burn out the ITO, which affects the contact signal transduction of the via hole, results in poor reliability and seriously affects the normal display of the display panel. Evidently, a via hole structure of another type may also have the two problems abovementioned.

Figure 5:
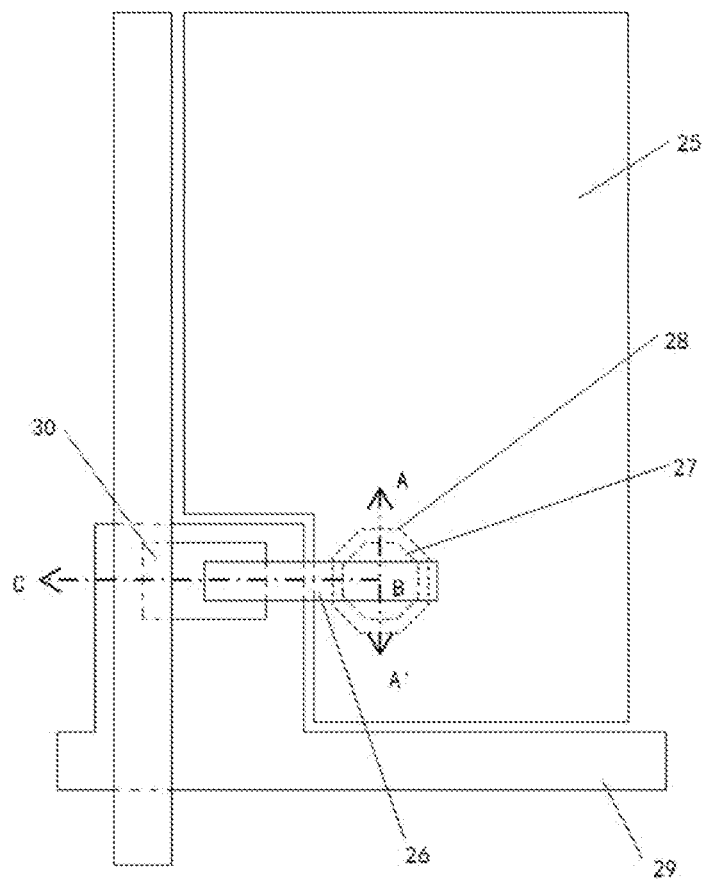
FIG. 5 is a schematic plan view of an array substrate according to one or more embodiments of the present disclosure.
Figure 6:
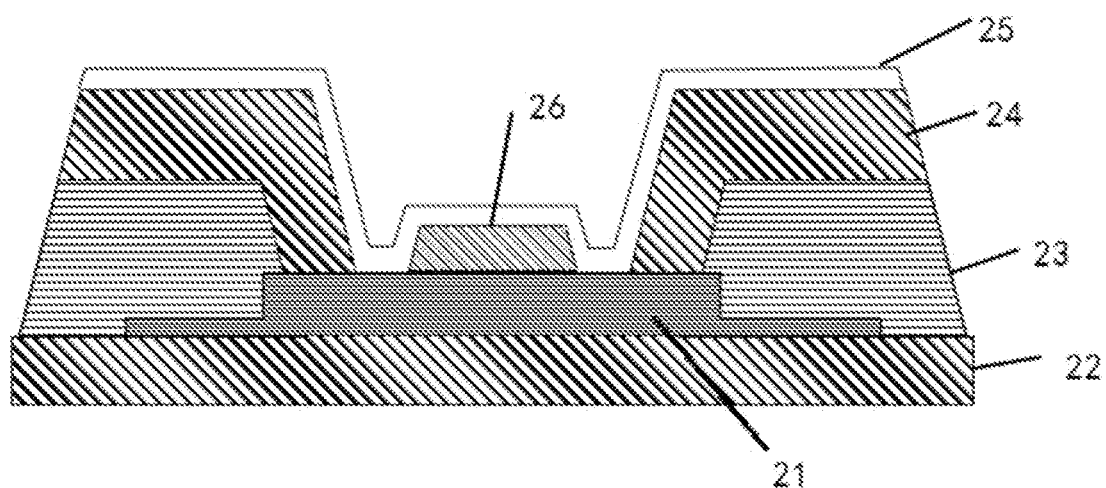
FIG. 6 is a schematic diagram of a half via hole structure according to one or more embodiments of the present disclosure.

Based on the abovementioned reasons, one or more embodiments of the present disclosure provide a half via hole structure, which is used to solve the problems of burn-out of a transparent conductive film layer (ITO) and abnormal contact of via hole, which are caused by a bad undercut of the via hole in a manufacturing flow of an array substrate. FIG. 5 is a schematic plan view of an array substrate according to an embodiment of the present disclosure. FIG. 6 is a schematic diagram of the half via hole structure according to the embodiment of the present disclosure, that is, FIG. 6 is a partial sectional view along A-B-A' direction in FIG. 5. Referring to FIGS. 5 and 6, the half via hole structure includes a spacer layer 21, a passivation layer 24, a first conductive layer 26, an insulating layer 23, and a second conductive layer 25. The spacer layer 21 is arranged on an underlaying substrate 22. The passivation layer 24 is arranged on the spacer layer 21 and is provided with a first via hole 27. An orthographic projection of the first via hole 27 on the underlaying substrate 22 is within an orthographic projection of the spacer layer 21 on the underlaying substrate 22. The first conductive layer 26 is arranged on the spacer layer 21 and has a width smaller than a diameter of the first via hole 27. The insulating layer 23 is arranged between the spacer layer 21 and the passivation layer 24 and is provided with a second via hole 28. The second conductive layer 25 is arranged on the passivation layer 24 and overlapped with the first conductive layer 26 through the first via hole 27.

In the present embodiment, the spacer layer 21 is arranged at the half via hole structure, the first conductive layer 26 is directly arranged on the spacer layer 21, and meanwhile, the second via hole 28 and the first via hole 27 are formed on the insulating layer 23 and the passivation layer 24 respectively in a manner that diameters of the second via hole 28 and the first via hole 27 are both larger than the width of the first conductive layer 26. Therefore, when the first via hole 27 is formed on the passivation layer 24, the spacer layer 21 may protect the insulating layer 23 from being over-etched to avoid the formation of weak point on the insulating layer 23, thus a common bad undercut of the half via hole in an array process is effectively improved, the transparent conductive film layer is prevented from being open and burnt out caused by the bad undercut, and the normal display of a display panel is ensured.

Meanwhile, comparison between the half via hole structure of the embodiment of the present disclosure and the half via hole structure shown in FIG. 2 shows that, at present, the insulating layer 23 below the first conductive layer 26 of the half via hole structure is partially etched off in the PVX etch process to form an undercut, which results in a poor contact when the second conductive layer 25 is overlapped. With the design of the half via hole structure of the embodiment of the present disclosure, a novel via hole slightly larger than the via hole of the passivation layer is formed by the spacer layer 21. Before the first conductive layer 26 is formed, the insulating layer 23 has been completely etched off, and a via hole without the insulating layer 23 is formed on the spacer layer 21, which is followed by the formation of the first conductive layer 26 and etching of the passivation layer (PVX etch). As such, the phenomenon of undercut will not exist, the second conductive layer 25, i.e., ITO, is overlapped well without abnormal contacts.

Figure 7:
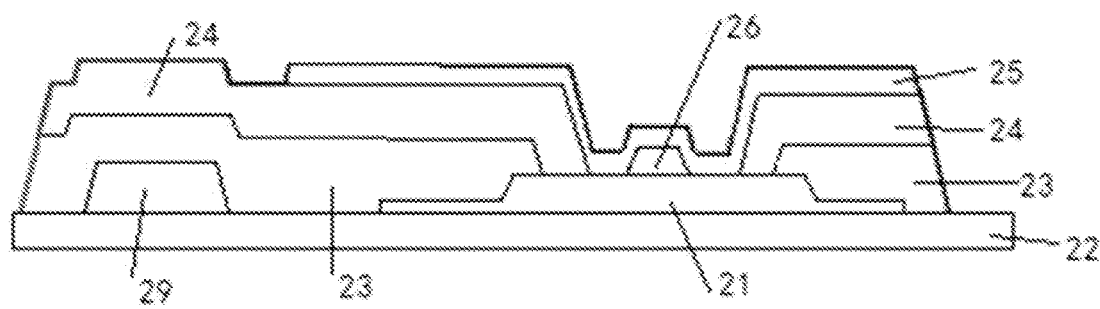
FIG. 7 is a sectional view along A-B-A' direction in FIG. 5.
Figure 8:
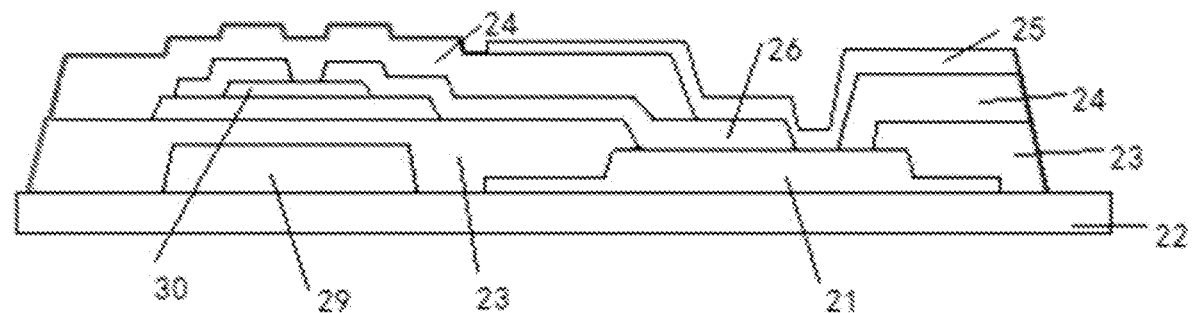
FIG. 8 is a sectional view along A-B-C direction in FIG. 5.

FIG. 5 is a schematic plan view of an array substrate according to the embodiment of the present disclosure. FIG. 7 is a sectional view along A-B-A' direction in FIG. 5. FIG. 8 is a sectional view along A-B-C direction in FIG. 5. In an exemplary implementation, multiple materials may be selected for the spacer layer 21, e.g., a metal compound formed by multiple layers of metals or other materials, as long as the passivation layer 24 is prevented from being over-etched during etching. The first conductive layer 26 is a drain metal layer (SD) of a thin film transistor. The insulating layer 23 is a gate insulating layer (GI). Besides a silicon dioxide thin film, a silicon nitride thin film, a silicon oxynitride thin film, an alumina thin film, or a titanium oxide thin film, the insulating layer 23 may be a thin film formed by another inorganic insulating material with a material characteristic same as or similar to that of the abovementioned substances. The passivation layer 24 has a one-layer or multilayer structure, and is formed of a silicon-rich material, including silicon oxide, silicon nitride, or silicon oxynitride. Silicon oxide, silicon nitride, or silicon oxynitride is formed by the reaction of N2O and SiH4, or N2O, SiH4, NH3, and N2, or SiH4, NH3, and N2, or SiH2Cl2, NH3, and N2. A gas reaction ratio between N2O and SiH4 ranges from 100:1 to 50:1. The second conductive layer 25 is an indium tin oxide (ITO) transparent conductive film layer. In an exemplary implementation mode, the second conductive layer 25 is 2ITO, namely may be a common electrode.

In one or more embodiments of the present disclosure, as shown in FIG. 5, the spacer layer 21 includes a spacer layer body and a spacer layer step connected to the spacer layer body. A thickness of the spacer layer step is smaller than that of the spacer layer body, so that the whole spacer layer 21 presents a state that the middle is thick and the periphery is thin. Meanwhile, an orthographic projection of the first via hole 27 on the underlaying substrate 22 is within an orthographic projection of the spacer layer body on the underlaying substrate 22, that is, the passivation layer 24 at an edge of the first via hole 27 is arranged on the spacer layer body. In such case, the spacer layer body with a relatively large thickness may effectively avoid the passivation layer 24 from being over-etched. The thickness of the spacer layer body is 5,000 to 6,000 Å. The thickness of the spacer layer step is 1,000 to 2,000 Å.

In an exemplary implementation mode, an orthographic projection of the second via hole 28 on the underlaying substrate 22 is within the orthographic projection of the spacer layer body on the underlaying substrate 22, that is, the insulating layer 23 at an edge of the second via hole 28 is arranged on the spacer layer body. In an exemplary implementation mode, the insulating layer 23 at the edge of the second via hole 28 may also be arranged on the spacer layer step, that is, the orthographic projection of the second spacer layer 28 on the underlaying substrate 22 is within an orthographic projection of the spacer layer step on the underlaying substrate 22.

In an exemplary implementation mode, as shown in FIG. 6, the second via hole 28 is provided to be concentric with the first via hole 27, and a diameter of the second via hole 28 is larger than that of the first via hole 27. In such case, when the first via hole 27 is formed on the passivation layer 24, only the spacer layer 21 is etched, while the insulating layer 23 is not etched. Therefore, the second conductive layer 25 may be prevented from being open or burnt out caused by an undercut formed by etching, thus the display effect of the display panel is ensured.

In an exemplary implementation mode, a material for forming the spacer layer 21 includes a metallic conductive material. For example, a metallic conductive material same as that of a gate metal layer 29 of the array substrate may be selected for manufacturing the spacer layer. The spacer layer 21 may be made of a material such as Aluminum (Al) and an aluminum alloy, or may be a metal compound conductive layer formed by stacking an aluminum layer, a tungsten layer, and a chromium layer. Or, the spacer layer 21 may also be made of Molybdenum (Mo), or Mo/Al/Mo. Mo/Al/Mo is three layers of metals, wherein the two layers of Mo serves for protection, and the layer of Al serves for conduction. However, no limits are made thereto in the present disclosure.

Figure 9:
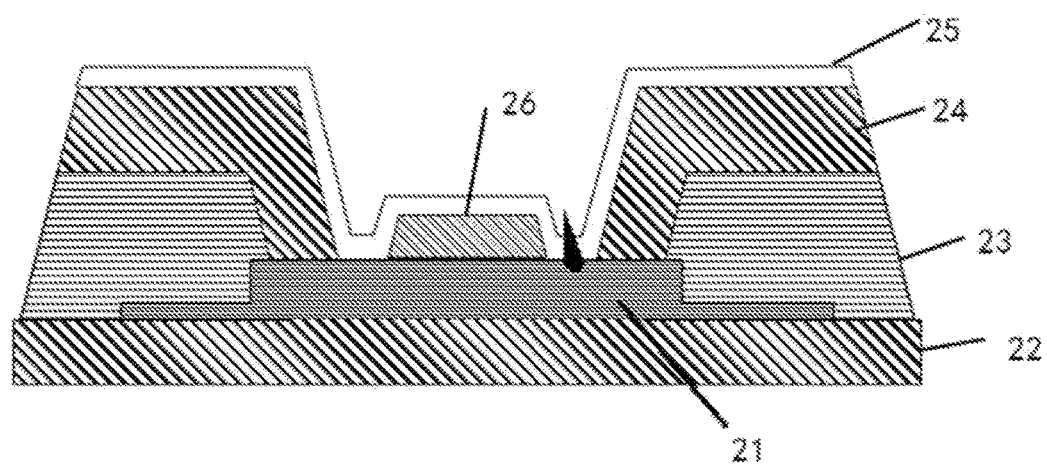
FIG. 9 is a schematic diagram showing that there is a foreign body in a half via hole structure according to one or more embodiments of the present disclosure.

When the spacer layer 21 is made of the same material as the gate metal layer 29, on one hand, the insulating layer 23 may be prevented from being over-etched during formation of the passivation layer 24, thereby effectively improving the phenomenon of bad undercut. On the other hand, the spacer layer may be formed simultaneously with the gate metal layer 29 of the array substrate in a same process flow without any additional process step, so that the process complexity is reduced. In addition, referring to FIG. 9, since the spacer layer 21 is also made of a metallic conductive material, even though the second conductive layer 25 is disconnected due to existence of a foreign matter during formation of the second conductive layer 25, in such case, the two cracked portions of the second conductive layer 25 may still be connected by the spacer layer 21 and the first conductive layer 26 as media to finally achieve a conduction effect. Such a design avoids the defect of 2ITO open caused by bad undercut of the half via hole, as well as poor ITO contact caused by the continuous accumulation of heat with the continuous increase of the load and signals in the reliability process, so that the yield, quality, and competitiveness of the product can be greatly improved. When the second conductive layer 25 is a common electrode (2ITO), the structure may reduce the defective rate of 12TO open caused by foreign matters or other reasons, and improves the quality of the product.

In addition, the overlapping effect of the ITO in the half via hole structure of the embodiment of the present disclosure is the same as that of an ordinary full-contact via hole, defects caused by the undercut in the manufacturing process and ITO burn-out in the reliability process may be effectively improved, meanwhile, the defective rate of 2ITO open caused by foreign matters or other reasons is greatly reduced, and the quality and competitiveness of the product are improved.

Figure 10:
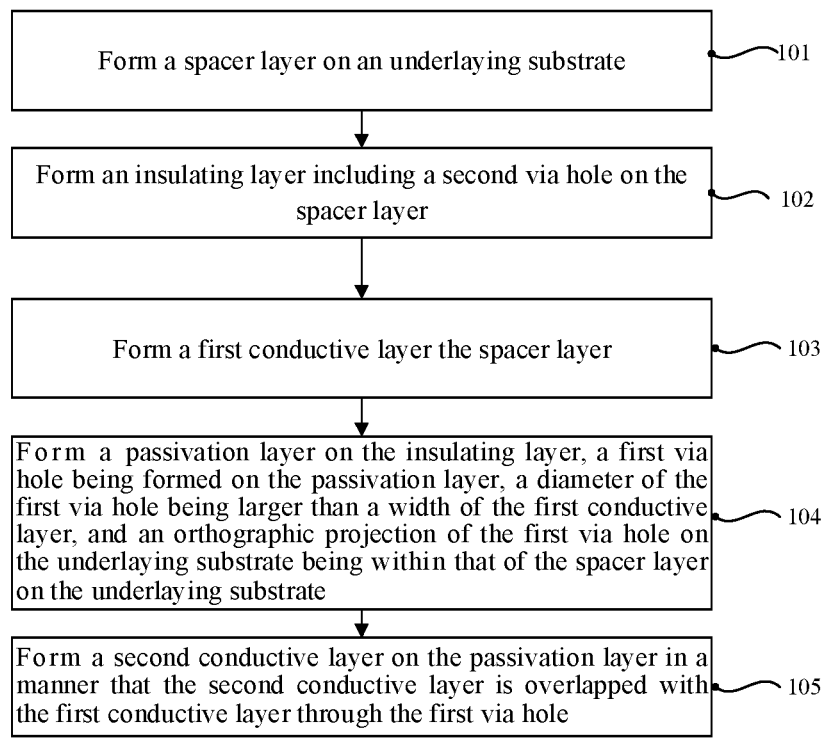
FIG. 10 is a flowchart of a method for manufacturing a half via hole structure according to one or more embodiments of the present disclosure.

One or more embodiments of the present disclosure provide a method for manufacturing a half via hole structure. As shown in FIG. 10, the method includes:

In Step 101, a spacer layer is formed on an underlaying substrate.

In some exemplary embodiments, the spacer layer 21 includes a spacer layer body and a spacer layer step connected to the spacer layer body. A thickness of the spacer layer step is smaller than that of the spacer layer body.

Figure 11:
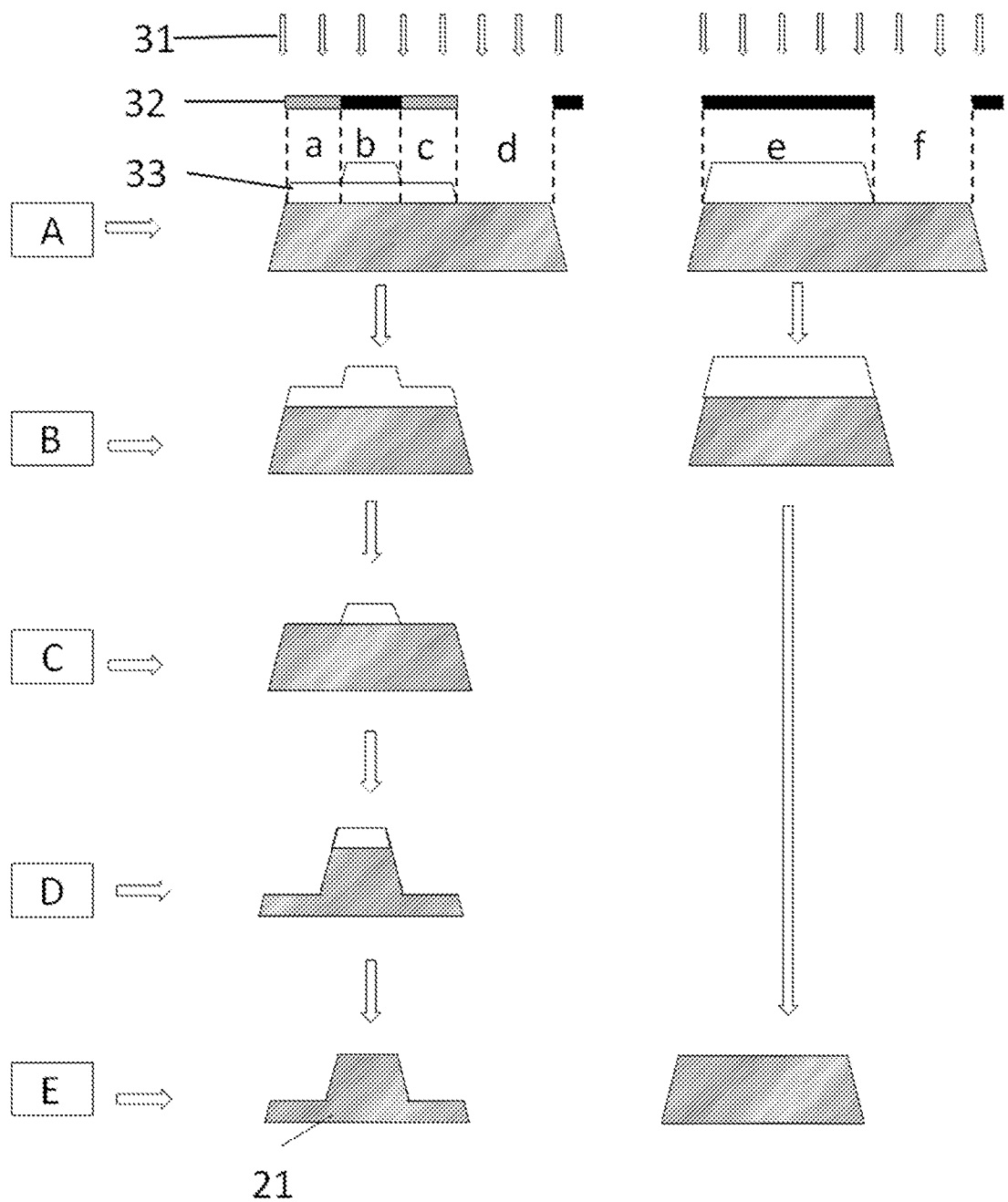
FIG. 11 is a schematic flowchart of forming a spacer layer according to one or more embodiments of the present disclosure.

The left of FIG. 11 is a schematic flowchart for forming the spacer layer 21. Referring to FIG. 11, the formation of the spacer layer on the underlaying substrate in Step 101 includes:

In Step 201, a spacer layer material is formed on the underlaying substrate.

In Step 202, a photoresist layer is formed on the spacer layer material in a manner that a thickness of a middle region of the photoresist layer is larger than that of a peripheral region.

Referring to procedure A in FIG. 11, i.e., a photo procedure, the photoresist (PR) layer 33 has different thicknesses in different regions, and the thickness of the middle region of the photoresist layer is larger than that of the peripheral region. This is related to transmittance conditions of a mask 32 in different regions. Position a and position c are semi-transmitting regions, and thicknesses of a first photoresist layer 33 at positions a and c is about 5,000 Å. Position b is a non-transmitting region, and a thickness of the first photoresist layer 33 at position b is about 1.5 μm. Position d is a fully transmitting region, the photoresist at position d has been completely developed after the photo etching procedure, and thus the position is not covered by the photoresist. Referring to procedure B in FIG. 10, 1st wet etch (etching) is performed on the spacer layer material to completely etch off the spacer layer material of the region, i.e., position d, which not covered by the first photoresist layer 33.

In Step 203, the photoresist layer of the peripheral region is stripped.

Referring to procedure C in FIG. 11, 1st ashing etch is performed on the first photoresist layer 33 to strip the relatively thin photoresist in the peripheral region. The photoresist layer of the middle region is relatively thick, and thus the photoresist may be partially retained.

In Step 204, the spacer layer material from which the photoresist layer is stripped is etched to form the spacer layer step.

Referring to procedure D in FIG. 11, 2nd wet etch is performed on the spacer layer material. Etching time of the current etching is adjusted to a half of the time of End Point Detection (EPD). In such case, the spacer layer material of the region not covered by the photoresist may not be completely etched off, and a certain film thickness of the spacer layer material may remain (the thickness of the remaining spacer layer material may be controlled by the etching time), thereby forming the spacer layer step.

In Step 205, the photoresist layer of a middle region is stripped to form the spacer layer body.

Referring to procedure E in FIG. 11, the remaining photoresist layer of the middle region may be stripped through a strip process to obtain the spacer layer body, namely obtaining the final spacer layer 21.

In the abovementioned embodiment, when the material for forming the spacer layer 21 is selected as a metallic conductive material, especially a metallic conductive material the same as that of the gate metal layer 29 or another metal layer belonging to the same layer, the spacer layer 21 may be formed at the same time when the gate metal layer 29 or another ordinary metal layer belonging to the same layer is formed. Referring to FIG. 11, taking the gate metal layer 29 as an example, in procedure A, the metal material of the gate metal layer (on the right of FIG. 11) and the spacer layer material are formed at the same time. In a corresponding region of the mask corresponding to the metal material of the gate metal layer, position e is a non-transmitting region, and the thickness of the photoresist layer at position e is also about 1.5 μm. Position f is a fully transmitting region, the photoresist at position f has been completely developed after the photo etching procedure, and thus the position is not covered by the photoresist. The metal material of the gate metal layer at the region, i.e., position f, which is not covered by the photoresist is also completely etched off in the subsequent 1st wet etch in procedure B. The metal material of the gate metal layer is not treated in procedures C and D. The remaining photoresist layer of the metal material of the gate metal layer is also stripped through the stripping process in procedure E, to obtain the gate metal layer 29. In such a manner, the spacer layer 21 may be directly formed when the gate metal layer 29 is formed, so that the own effect of the spacer layer 21 is ensured, meanwhile, the process steps for forming the spacer layer 21 are reduced, and the process complexity is reduced.

In Step 102, an insulating layer 23 is formed on the spacer layer 21, wherein the insulating layer 23 includes a second via hole 28.

Figure 12:
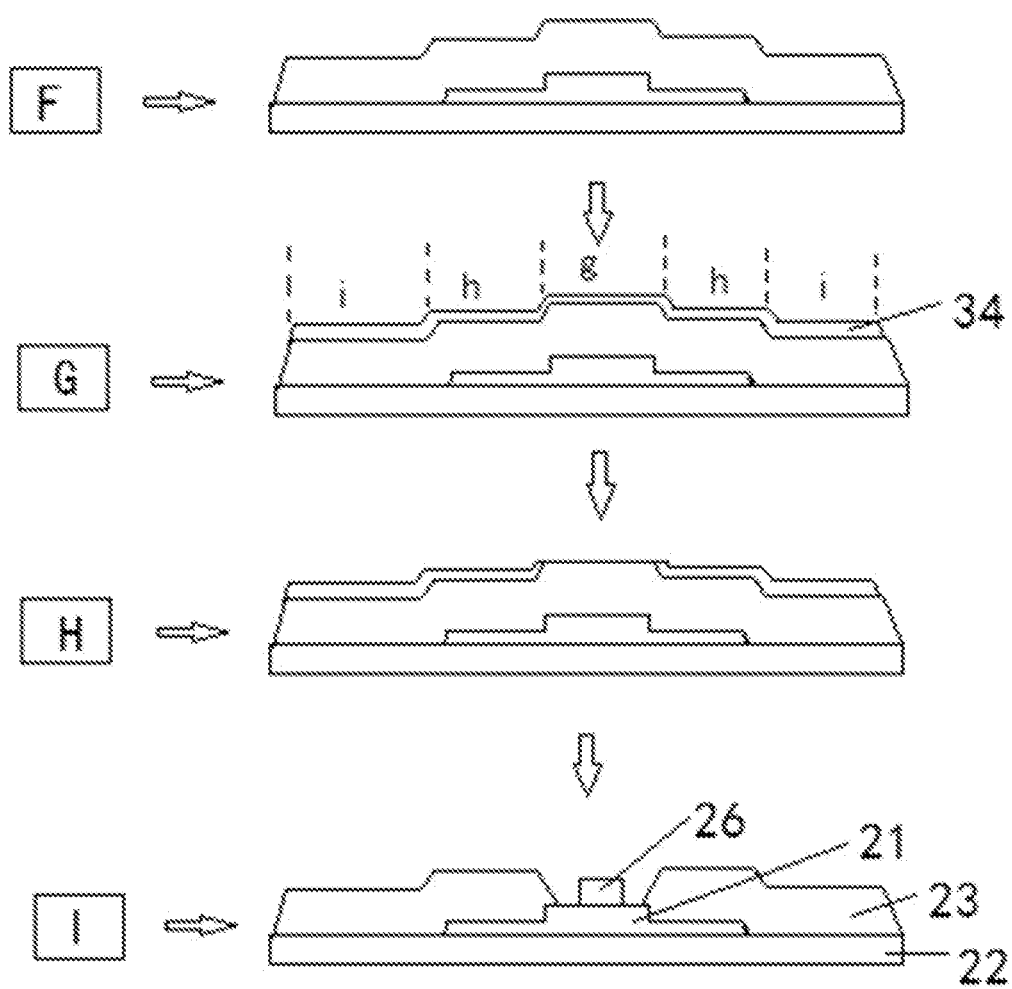
FIG. 12 is a schematic flowchart of forming an insulating layer and a first conductive layer according to one or more embodiments of the present disclosure.

As shown in FIG. 12, the formation of the insulating layer 23 on the spacer layer 21 includes:

In Step 301, an insulating layer material is formed on the spacer layer 21, wherein an area of the insulating layer material is larger than that of the spacer layer 21.

Referring to procedure F in FIG. 12, an active layer (Active) 30 is formed at the position of a thin film transistor after the insulating layer 23, i.e., a gate insulating layer, is normally formed on the spacer layer 21. The region where the half via hole structure is manufactured includes no active layer 30 but only the insulating layer 23 after the active layer 30 is formed.

In Step 302, a photoresist layer is formed on the insulating layer material.

Referring to procedure G in FIG. 12, the product placed in a coating developer (Track) to be coated with a second photoresist layer 34. Due to the existence of a step between the spacer layer 21 and the underlaying substrate 22, the insulating layer 23 formed on the spacer layer 21 also has a corresponding step, which makes the thickness of the second photoresist layer 34 at the step inconsistent. In the embodiment shown in FIG. 12, the spacer layer 21 includes a spacer layer body and a spacer layer step. There is also a step between the spacer layer step and the underlaying substrate 22, so that the thicknesses of the photoresist at position g, position h, and position i are all inconsistent with one another. The differences between the thicknesses of the photoresist at position g, position h, and position i are determined by a design segment gap of the spacer layer 21. In an exemplary embodiment, when the thickness of the spacer layer body at position g is 5,000 Å, and the thickness of the spacer layer step at position h is 1,000 Å, according to the standard of 1.5 µm of the photoresist, the second photoresist layer 34 at position g with the smallest thickness of photoresist is 1.5 µm, the second photoresist layer 34 at position h with a relatively large thickness of photoresist is 1.4 µm, and the second photoresist layer 34 at position i with the largest thickness of photoresist is 1.0 µm. This is caused by the arrangement of the spacer layer 21 and the segment gap in its own structural, and no additional mask process is needed. Therefore, when the second via hole 28 is formed in a subsequent process, one time of mask process may be reduced, thus the process complexity is reduced.

In Step 303, the photoresist layer of an insulating layer material region above the spacer layer 21 is stripped, and the insulating layer material region is etched to form the second via hole 28.

Referring to procedure H in FIG. 12, ashing is performed on the second photoresist layer 34 to completely strip the photoresist layer at position g with the smallest thickness of photoresist to expose the insulating layer 23 below. At this point, position h and position i are still covered by the photoresist. Afterwards, the second via hole 28 is formed on the insulating layer 23 through an etching process in a manner that an orthographic projection of the second via hole 28 on the underlaying substrate 22 is within an orthographic projection of the spacer layer body on the underlaying substrate 22.

In Step 304, the photoresist layer of another region is stripped.

Referring to procedure I in FIG. 12, the remaining photoresist layer is stripped through the strip process.

In Step 103, a first conductive layer 26 is formed on the spacer layer 21. An orthographic projection of a first via hole 27 on the underlaying substrate 22 is within an orthographic projection of the spacer layer 21 on the underlaying substrate 22.

In Step 104, a passivation layer 24 is formed on the insulating layer 23. The first via hole 27 is formed on the passivation layer 24. A diameter of the first via hole 27 is larger than a width of the first conductive layer 26. An orthographic projection of the first via hole 27 on the underlaying substrate 22 is within an orthographic projection of the spacer layer 21 on the underlaying substrate 22. The orthographic projection of the first via hole 27 on the underlaying substrate 22 is inside within an orthographic projection of the spacer layer 21 body on the underlaying substrate 22.

In Step 105, a second conductive layer 25 is formed on the passivation layer 24 in a manner that the second conductive layer 25 is overlapped with the first conductive layer 26 through the first via hole 27.

The method for manufacturing a half via hole structure in the abovementioned embodiment is used to manufacture the corresponding half via hole structure in the abovementioned embodiment, and has the beneficial effects of the corresponding embodiment of the half via hole structure, which will not be described repeatedly here.

The order of the steps of the method for manufacturing a half via hole structure in the embodiment of the present disclosure may be properly adjusted. The steps may also be correspondingly added and deleted according to situations. Any method readily conceived by those skilled in the art within the technical scope disclosed by the present disclosure shall fall within the scope of protection of the present disclosure, which will not be described repeatedly here.

One or more embodiments of the present disclosure provide an array substrate, which includes an underlaying substrate 22 and any one of the abovementioned half via hole structures arranged on the underlaying substrate 22. The underlaying substrate 22 may be a glass substrate. The glass substrate is homogeneous in material, high in transparency and thermal stability, and low in reflectivity, and thus can keep a stable property after multiple high-temperature processes. The use of many chemicals for a TFT manufacturing process requires high chemical resistance of the glass substrate. The glass substrate is also required to have enough mechanical strength, high precision machining characteristic, and high electrical insulation characteristic. Multiple half via hole structures may be arranged on the underlaying substrate 22.

One or more embodiments of the present disclosure further provide a display panel, which includes the array substrate as described in any abovementioned implementation mode or embodiment.

The display panel may be used for a touch screen, a TFT-Liquid Crystal Display (TFT-LCD), an Organic Light-Emitting Diode (OLED) display, and may also be applied extensively to various large-sized, medium-sized, and small-sized products, covering main electronic products in today's information society, e.g., many fields such as liquid crystal televisions, computers, mobile phones, Personal Digital Assistants (PDAs), Global Positioning Systems (GPSs), car monitors, projection displays, video cameras, digital cameras, electronic watches, calculators, electronic instruments, meters, public displays, and virtual display.

In summary, it can be seen from the above that, according to the half via hole structure, method for manufacturing the same, array substrate, and display panel in one or more embodiments of the present disclosure, the spacer layer is arranged at the half via hole structure, the first conductive layer is directly arranged on the spacer layer, and meanwhile, the second via hole and the first via hole are formed on the insulating layer and the passivation layer respectively in a manner that diameters of the second via hole and the first via hole are both larger than the width of the first conductive layer. Therefore, when the first via hole is formed on the passivation layer, the spacer layer may protect the insulating layer from being over-etched to avoid the formation of weak point on the insulating layer, a common bad undercut of the half via hole in an array process is effectively improved, the transparent conductive film layer is prevented from being open and burnt-out caused by the bad undercut, and the normal display of the display panel is ensured.

Those of ordinary skill in the art should know that discussions about any above embodiment are only exemplary and not intended to limit the scope (including the claims) of the present disclosure to these examples. Under the concept of the present disclosure, the above embodiments or technical features in different embodiments may also be freely combined, the steps may be implemented in any order, and many other modifications in different aspects of one or more embodiments of the present disclosure may be made and are not provided in details for simplicity.

In addition, the connection with known power of an Integrated Circuit (IC) chip and another component or the ground may or may not be illustrated in the provided drawings, to simplify the description and the discussion and make one or more embodiments of the present disclosure easy to understand. Moreover, the devices may be illustrated in form of block diagram to make one or more embodiments of the present disclosure easy to understand. This also considers such a fact that details about the implementation modes of the devices in the block diagrams highly depend on the platform intended to implement one or more embodiments of the present disclosure (namely these details should be completely in the understanding range of those skilled in the art). With the specific details (for example, circuits) elaborated to describe the exemplary embodiments of the present disclosure, it is apparent to those skilled in the art that one or more embodiments of the present disclosure may be implemented without these specific details or in case that these specific details change. Therefore, these descriptions should be considered as illustrative rather than restrictive.

Although the present disclosure has been described in combination with the specific embodiments of the present disclosure, many replacements, modifications, and transformations made to these embodiments according to the above descriptions are apparent to those of ordinary skill in the art. For example, the discussed embodiments may be used for other memory architectures (for example, a Dynamic Random Access Memory (DRAM)).

One or more embodiments of the present disclosure are intended to cover all such replacements, modifications, and transformations fallen within the broad scope of the appended claims. Therefore, any omissions, modifications, equivalent replacements, improvements, etc., made within the essence and principle of one or more embodiments of the present disclosure shall fall within the scope of protection of the present disclosure.

What is claimed is:

1. A half via hole structure, comprising:
    a spacer layer, arranged on an underlaying substrate;
    a passivation layer, arranged on the spacer layer and provided with a first via hole, wherein an orthographic projection of the first via hole on the underlaying substrate is within an orthographic projection of the spacer layer on the underlaying substrate;
    a first conductive layer, arranged on the spacer layer and having a width smaller than a diameter of the first via hole;
    an insulating layer, arranged between the spacer layer and the passivation layer and provided with a second via hole; and
    a second conductive layer, arranged on the passivation layer and overlapped with the first conductive layer through the first via hole;
    wherein a material for forming the spacer layer comprises a metallic material.

2. The half via hole structure according to claim 1, wherein the spacer layer comprises a spacer layer body and a spacer layer step connected to the spacer layer body, and a thickness of the spacer layer step is smaller than a thickness of the spacer layer body.

3. The half via hole structure according to claim 2, wherein the orthographic projection of the first via hole on the underlaying substrate is within an orthographic projection of the spacer layer body on the underlaying substrate; and an orthographic projection of the second via hole on the underlaying substrate is within the orthographic projection of the spacer layer body on the underlaying substrate.

4. The half via hole structure according to claim 3, wherein the second via hole is provided to be concentric with the first via hole, and a diameter of the second via hole is larger than a diameter of the first via hole.

5. The half via hole structure according to claim 2, wherein the thickness of the spacer layer body is 5,000 to 6,000 Å, and the thickness of the spacer layer step is 1,000 to 2,000 Å.

6. The half via hole structure according to claim 1, wherein the material for forming the spacer layer comprises a metallic conductive material.

7. An array substrate, comprising the half via hole structure according to claim 1.

8. A display panel, comprising the array substrate according to claim 7.

9. A method for manufacturing a half via hole structure, comprising:
    forming a spacer layer on an underlaying substrate;
    forming an insulating layer on the spacer layer, wherein the insulating layer comprises a second via hole;
    forming a first conductive layer on the spacer layer;
    forming a passivation layer on the insulating layer, wherein a first via hole is formed on the passivation layer, a diameter of the first via hole is larger than a width of the first conductive layer, and an orthographic projection of the first via hole on the underlaying substrate is within an orthographic projection of the spacer layer on the underlaying substrate; and
    forming a second conductive layer on the passivation layer in a manner that the second conductive layer is overlapped with the first conductive layer through the first via hole;
    wherein a material for forming the spacer layer comprises a metallic material.

10. The method for manufacturing a half via hole structure according to claim 9, wherein the spacer layer comprises a spacer layer body and a spacer layer step connected to the spacer layer body, and a thickness of the spacer layer step is smaller than a thickness of the spacer layer body, wherein forming the spacer layer on the underlaying substrate comprises:
    forming a spacer layer material on the underlaying substrate;
    forming a photoresist layer on the spacer layer material in a manner that a thickness of a middle region of the photoresist layer is larger than a thickness of a peripheral region;

stripping the photoresist layer of the peripheral region;
etching the spacer layer material from which the photoresist layer is stripped to form the spacer layer step; and
stripping the photoresist layer of the middle region to form the spacer layer body.

11. The method for manufacturing a half via hole structure according to claim 10, further comprising:
making the orthographic projection of the first via hole on the underlaying substrate located within an orthographic projection of the spacer layer body on the underlaying substrate; and
making an orthographic projection of the second via hole on the underlaying substrate located within the orthographic projection of the spacer layer body on the underlaying substrate.

12. The method for manufacturing a half via hole structure according to claim 9, wherein forming the insulating layer on the spacer layer comprises:
forming an insulating layer material on the spacer layer, wherein an area of the insulating layer material is larger than an area of the spacer layer;
forming a photoresist layer on the insulating layer material;
stripping the photoresist layer of a region of the insulating layer material above the spacer layer, and etching the region of the insulating layer material to form the second via hole; and
stripping the photoresist layer of another region of the insulating layer material.

* * * * *